United States Patent
Wokil et al.

(10) Patent No.: US 7,984,645 B2
(45) Date of Patent: Jul. 26, 2011

(54) METHOD OF VERIFYING THE STRENGTH OF A VEHICLE IN COMBINATION WITH AUXILIARY EQUIPMENT FITTED

(75) Inventors: Hayder Wokil, Ytterby (SE); Mattias Nyström, Göteborg (SE); Mats Gustavsson, Mölndal (SE)

(73) Assignee: Volvo Lastvagnar AB, Göteborg (SE)

( * ) Notice: Subject to any disclaimer, the term of this patent is extended or adjusted under 35 U.S.C. 154(b) by 326 days.

(21) Appl. No.: 11/575,754

(22) PCT Filed: Sep. 6, 2005

(86) PCT No.: PCT/SE2005/001291
§ 371 (c)(1),
(2), (4) Date: Jun. 27, 2008

(87) PCT Pub. No.: WO2006/033610
PCT Pub. Date: Mar. 30, 2006

(65) Prior Publication Data
US 2008/0264159 A1    Oct. 30, 2008

(30) Foreign Application Priority Data
Sep. 22, 2004   (SE) ...................... 0402297

(51) Int. Cl.
*G01M 17/00* (2006.01)
(52) U.S. Cl. .................................... 73/117.01
(58) Field of Classification Search ........... 73/11.04, 73/11.07, 117.01, 669
See application file for complete search history.

(56) References Cited

U.S. PATENT DOCUMENTS

| | | | | |
|---|---|---|---|---|
| 5,729,463 | A * | 3/1998 | Koenig et al. | 700/98 |
| 5,877,414 | A * | 3/1999 | Rui et al. | 73/146 |
| 5,880,362 | A | 3/1999 | Tang et al. | |
| 6,077,302 | A * | 6/2000 | Kumra et al. | 703/7 |
| 6,725,168 | B2 * | 4/2004 | Shiraishi et al. | 702/81 |
| 6,760,693 | B1 * | 7/2004 | Singh et al. | 703/8 |
| 6,766,206 | B1 * | 7/2004 | Jasuja et al. | 700/98 |
| 7,133,812 | B1 * | 11/2006 | Weber et al. | 703/8 |
| 7,194,888 | B1 * | 3/2007 | Temkin et al. | 73/11.04 |
| 7,542,887 | B2 * | 6/2009 | Brughmans et al. | 703/2 |
| 2003/0195725 | A1 | 10/2003 | Hashash | |

OTHER PUBLICATIONS

International Search Report from corresponding International Application PCT/SE2005/001291.
International Preliminary Examination Report from corresponding International Application PCT/SE2005/001291.

* cited by examiner

*Primary Examiner* — Freddie Kirkland, III
(74) *Attorney, Agent, or Firm* — WRB-IP LLP

(57) ABSTRACT

A method of verifying the strength of a vehicle in combination with auxiliary equipment fitted includes steps in which the vehicle chassis number or specification number are specified so that the vehicle specification and its parameters can be collected in a vehicle database, the parameters of the auxiliary equipment are specified, and a strength calculation for the vehicle is performed, based on the parameters of the vehicle and auxiliary equipment. In this way an assessment whether a reinforcement is needed when auxiliary equipment is fitted to a vehicle can be made.

20 Claims, 1 Drawing Sheet

METHOD OF VERIFYING THE STRENGTH OF A VEHICLE IN COMBINATION WITH AUXILIARY EQUIPMENT FITTED

BACKGROUND AND SUMMARY

The present inventions relates to a method of verifying the strength of a vehicle when the vehicle is fitted with auxiliary equipment.

Heavy vehicles can be ordered from the vehicle manufacturer with innumerable different specifications and equipment options. In the case of a truck, for example, the customer may specify the wheelbase, axle loads, engine, transmission, vehicle length etc. There are also a lot of accessories which are not provided by the actual manufacturer but which are fitted by various vehicle builders. This may be a tail lift, a towing coupling, a crane or the like, for example. It is important, especially in the case of accessories which are heavy and/or which may place an asymmetrical load on the vehicle, that the vehicle ordered should be adapted and prepared for the intended equipment. For a truck with a long overhang, for example, the rear part of the frame may need to be reinforced so that it will be strong enough to withstand the forces to which the frame is subjected when the equipment is fitted.

In order to adapt a vehicle for the intended equipment, a number of tables and diagrams are currently used.

These tables and diagrams can assist the vehicle builder in assessing whether and to what extent the frame of a truck, for example, needs to be strengthened in order to cope with auxiliary equipment. The problem with this is firstly that these tables and diagrams are quite general, which means that the vehicle builder may make the reinforcement unnecessarily strong and therefore heavy in order to be on the safe side. Another problem is that the vehicle manufacturer has to continually update these tables and diagrams in order to take account both of new components and systems on the vehicles and of new variants of the vehicles. In addition the vehicle builder has to continually update his tables and diagrams and must furthermore be able to determine which vehicle specification a special vehicle will approximate to before he can read the information off from a table, for example.

There are also a number of programs into which the vehicle builder himself can feed all the information on a vehicle, so as to be able to perform calculations of the strength when an item of equipment is fitted, for example. The disadvantage with this is that it is time-consuming and difficult to specify all essential parameters for a vehicle, and that it is easy to specify an incorrect value for a parameter. For example, the vehicle manufacturer may have changed a specification without the knowledge of the vehicle builder.

It is desirable to provide a method of verifying the strength of a vehicle in combination with auxiliary equipment fitted which is as simple and reliable as possible.

The method according to an aspect of the invention is adapted to verify the strength of a vehicle in combination with auxiliary equipment fitted by collecting the vehicle specification and its parameters in a vehicle database on the basis of the vehicle chassis number or specification number and then performing a strength calculation using the vehicle parameters and the parameters of the auxiliary equipment.

This first embodiment of the method according to an aspect of the invention allows the strength of a vehicle with auxiliary equipment fitted to be verified on the basis of the chassis number or specification number of the vehicle. The advantage of this is that a combination of vehicle and auxiliary equipment can be tested before the vehicle is being built. This means that any necessary reinforcements can be incorporated into the vehicle when the vehicle is built. The combination of vehicle, auxiliary equipment and reinforcement can moreover be optimized so as to provide a reinforcement which meets the relevant requirements but which is at the same time as light as possible.

In an advantageous first development of the method according to an aspect of the invention it is also possible to calculate the handling characteristics for the combination of the vehicle and the auxiliary equipment.

The advantage of this, for example, is that the stability of the vehicle can be calculated before the vehicle is built.

BRIEF DESCRIPTION OF THE DRAWINGS

The invention will be described in more detail below with reference to exemplary embodiments, which are shown in the drawings attached, of which

DETAILED DESCRIPTION

Figure 1:
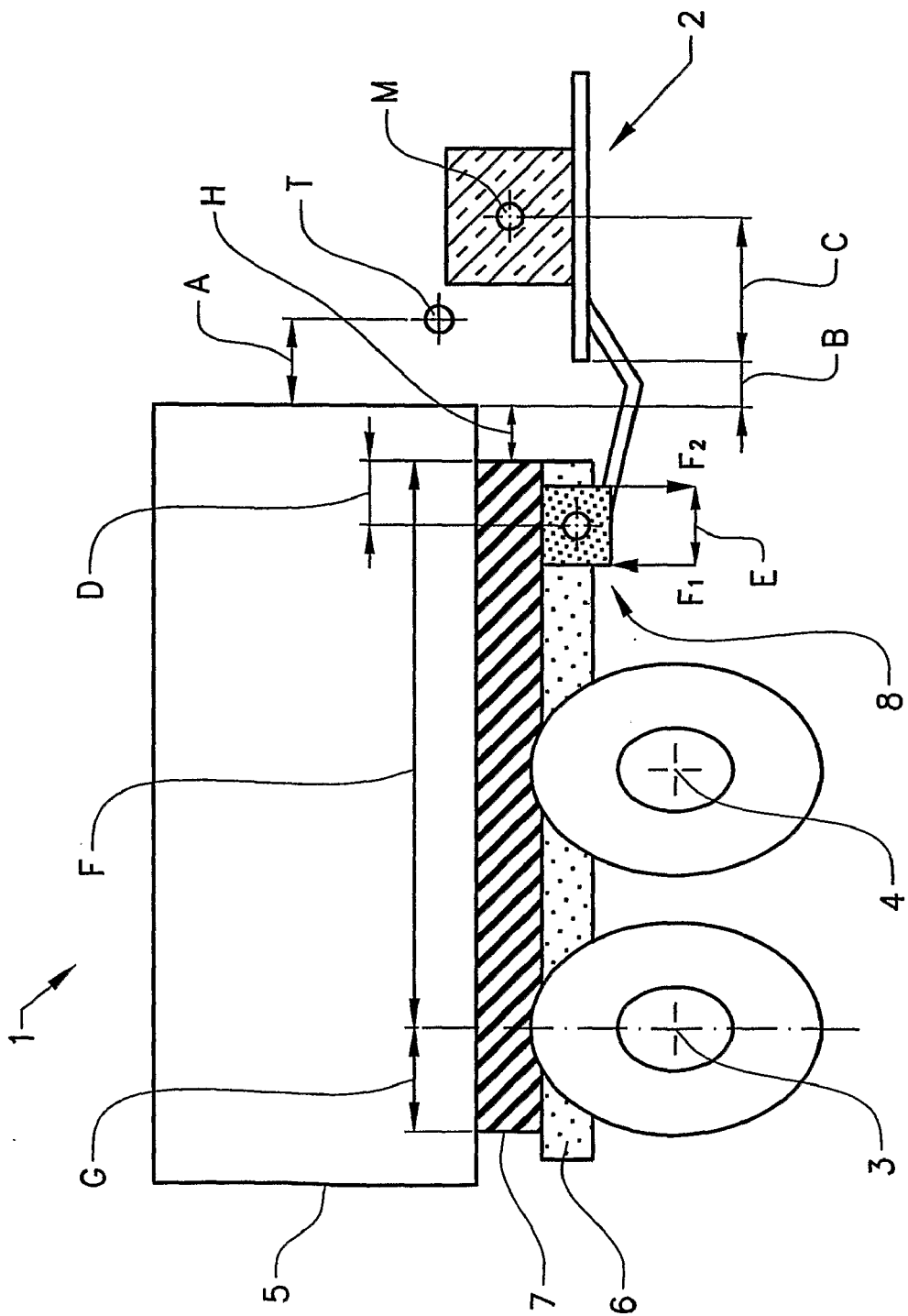
FIG. 1 shows a schematic view of the rear part of a vehicle equipped with a tail lift.

The exemplary embodiments of the invention described below together with further developments must be regarded only as examples and do not in any way limit the scope of the patent claims. FIG. 1 shows the rear part of a vehicle 1 equipped with a tail lift 2. The vehicle comprises a leading rear axle 3 and a trailing rear axle 4, a frame 6 and an auxiliary frame 7. The vehicle is further equipped with a box body 5. The tail lift 2 is fitted to the vehicle frame by an anchorage 8.

Heavy vehicles, such as trucks, are normally ordered with the specification requested by the customer. There is certain equipment, however, which the vehicle manufacturer does not provide. This equipment must therefore be procured and fitted elsewhere. It is usually a garage workshop that specializes in fitting auxiliary equipment, a so-called vehicle builder, which does this. In some cases it is merely a matter of fitting an additional component, such as a tail lift, lumber crane or towing arrangement, for example. In other cases it may involve the conversion of major parts of the vehicle, as when the vehicle is to become a fire engine, for example.

When fitting an additional component, such as a tail lift, it is important that the vehicle also meets the strength demands imposed on the vehicle once the component has been fitted. The vehicle builder therefore usually makes the necessary reinforcements to the vehicle, for example by fitting an auxiliary frame to the frame of the vehicle. Since the vehicle in this case is ready-built, parts of the vehicle often have to be dismantled in order to be able to fit the auxiliary frame. Parts of the vehicle sometimes even have to be removed, the frame having to be shorted, for example, in order to be able to fit a component.

The design dimensioning of the reinforcement has to be read off from tables and/or diagrams. First the table or the diagram which corresponds most closely to the specification of the vehicle in question is selected. The dimensions of the necessary reinforcement are then read off from the table or the diagram. Since the tables or the diagrams are not available for each separate vehicle, an approximation to the vehicle type first has to be made. The reinforcements are furthermore specified only in intervals. In order to ensure that the finally equipped vehicle will meet the relevant strength requirements, this means that the reinforcement is often oversized and hence heavier than is necessary, which results in a correspondingly lower load capacity for the customer.

The method disclosed here is primarily advantageous when fitting equipment that subjects the vehicle frame to spot-loading, that is to say components which are fixed to a smaller part of the vehicle, which results in a high load acting on one part of the vehicle frame. Examples of such components might be a tail lift, a lifting crane or a towing arrangement. The method may also be suitable for vehicles which are to be adapted for an asymmetrical load. For example, it is also possible to calculate the strength for a vehicle which is to have a facility for suspending an industrial truck right at the back of the vehicle. In the case of dispersed loads the usual dimensioning methods may be used.

The invention can facilitate an optimization for a certain combination of vehicle, additional component and the reinforcements that are required. For example, certain parameters for the vehicle or the additional component can be adjusted in order to achieve the required strength. Provided that it meets the strength requirements, the reinforcement may be optimized either with regard to the weight or with regard to the cost. On the cost side, for example, account may be taken of the fact that certain reinforcements are less expensive to fit. This is done in a number of steps. First the specifications of the vehicle and associated parameters, which are needed in order to be able to perform the calculations, are collected. Where the vehicle has already been ordered, this may be done by using the chassis number of the vehicle. With the vehicle chassis number all parameters needed in order to calculate the strength can be collected from the vehicle specification in a vehicle database. Where the vehicle has not yet been ordered, that is to say when the vehicle does not have a chassis number, a vehicle can be built virtually with a specification program, for example with a so-called "forward order" program, so that a specification number for the vehicle is obtained, which corresponds to a chassis number. With the specification number it is possible, in the same way as with a chassis number, to collect all parameters needed to calculate the strength from the vehicle specification in a vehicle database. This first step is advantageously performed on a first input page, for example on a home page on the internet.

Some of the variants of a vehicle which can affect the strength calculations are the product class, version, frame type, frame height, frame length, vehicle length, any reinforcement, chassis type, wheelbase, front axle specification, rear axle specification, type of front and rear suspension, number of rear axles, cab type, engine type etc.

The next step involves specification of the component that is to be fitted to the vehicle. This is done either by selecting components from a list of possible components, or by specifying a number of specific parameters for the component in question. This inputting of parameters is advantageously performed on a second input page, for example on a home page on the internet. The parameters that are used in the exemplary embodiment described (see also FIG. 1) applying to strength calculations for a vehicle in combination with a tail lift are:

A: The distance between the rear edge of the vehicle and the center of gravity of the tail lift
B: The distance between the rear edge of the vehicle and the front edge of the tail lift load platform
C: The distance between the front edge of the tail lift load platform and the center of gravity for a maximum load
D: The distance between the center of gravity of the tail lift anchorage and the rear edge of the frame
E: The distance between the outer fixing points of the tail lift anchorage
F: The distance between the front wheel axle of the vehicle and the rear edge of the frame
G: The distance between the front edge of the auxiliary frame and the front wheel axle of the vehicle
H: The distance between the rear edge of the frame and the rear edge of the vehicle
M: The load capacity of the tail lift
T: The total mass of the tail lift $$F_x = \frac{M*(C+300+H+D)+T*(A+H+D)}{E} \times 9.81 \qquad (1)$$

$$F_1 = \frac{M+T}{2} \times 9.81 - F_x \qquad (2)$$

$$F_2 = \frac{M+T}{2} \times 9.81 + F_x \qquad (3)$$

In this example $F_1$ is the compressive force on the tail lift front anchorage and $F_2$ is the tensile force on the tail lift rear anchorage. $F_x$ is a force value which is used in calculating $F_1$ and $F_2$. The results obtained are used to assess the tensile and compressive forces acting on the vehicle frame. If the load on the upper and lower flange of the frame and the flexure of the frame lie within a predefined interval, no reinforcement of the frame is necessary. If the load on the upper or lower flange of the frame lies outside a predefined value or if the flexure of the frame lies outside a predefined interval, a reinforcement of the vehicle frame is required. The reinforcement can be carried out in various ways. The most usual thing is either to place a reinforcing member in the frame, a so-called "inner liner", or to fit an auxiliary frame on top of the vehicle frame, a so-called "upper liner". Other types of reinforcements are also possible. What type of reinforcement is chosen depends on several factors, for example on the size of the load and on the space available for the reinforcement.

When all parameters have been fed in, the strength calculation is performed. The result of the strength calculation may be presented in a number of different ways. What is important is to clearly demonstrate whether the combination of vehicle and component will meet the strength requirements laid down. If the combination of vehicle and component meets the strength requirements laid down, this may be shown, for example, on a results page.

The strength calculations may either be performed solely on static load cases or dynamic load cases may also form part of the strength calculations. Where the dynamic characteristics are also to be calculated, an estimate is needed of which dynamic stresses the vehicle will be exposed to. This estimate may be obtained from the vehicle specification, since the vehicle specification also covers the type of maximum loads the vehicle is designed for;

Should the combination of vehicle and component not meet the strength requirements laid down, this is also shown on a results page, for example. In this latter case, when the result of the strength calculation lies outside the predefined interval, the strength calculation must be repeated with adjusted parameters. This may be done either by changing the component, by changing some parameter of the vehicle or by adding a reinforcement to the vehicle. Changing a vehicle parameter is of course only possible when the vehicle has been specified with a specification number. A reinforcement may either be selected from a list of predefined reinforcements or a desired reinforcement may be created by specifying dimensions, material etc. for the required reinforcement. The creation of a required reinforcement can be done, for example, on a special reinforcement page and the reinforcement created may be added to the list of predefined reinforcements.

When the parameters have been modified and/or a reinforcement has been added, a new strength calculation is performed. The result is suitably presented on the results page. In this way the strength of a number of different combinations of vehicle, components and reinforcements can readily be established. When a combination with which the customer is satisfied has been found, this combination can be suitably saved, for example in a database. If the vehicle has been specified with a specification number, the reinforcement worked out may be added to the vehicle specification and hence to an order list, so that the reinforcement can be ready fitted when the vehicle is being produced. This saves both time and money, since the reinforcement can be fitted at the correct stage in the production process, before other components are fitted which would otherwise be in the way of the reinforcement.

This method also gives the vehicle manufacturer the facility to supply the customer with a complete vehicle without the customer having to go to a vehicle builder. Even if a vehicle builder fits the specific component, such as a tail lift, the vehicle manufacturer can deliver a vehicle which meets the requirements placed on the vehicle also when the component is fitted. This not only makes things easier for the customer but also ensures that the vehicle meets the specifications and requirements laid down for this. Furthermore, the quality of the vehicle can be improved, since the reinforcement can be fitted in a controlled and secure manner. Some vehicle builders may weld reinforcements, for example, which can not only affect the strength of the frame but can also impair the corrosion protection of the frame.

In a further development of the method according to the invention it is not only the strength of the chosen combination of vehicle and component that is calculated, but also the handling characteristics for the chosen combination. The handling characteristics include the lateral stability, for example. The lateral stability is affected, for example, when a crane is fitted to the vehicle, since the crane raises the center of gravity of the vehicle as a whole. The stability is also affected according to where on the vehicle the crane is mounted. If the crane is fitted i to the front part of the vehicle, behind the driver's cab, it is basically the change to the center of gravity of the complete vehicle imposed by the crane that has an effect on the stability characteristics. If the crane is fitted to the rear part of the vehicle, far back on the overhang, for example, it is both the change to the center of gravity of the whole vehicle imposed by the crane and the weight of the crane right at the back of the vehicle that affect the stability characteristics.

There are also handling characteristics which affect the driver's experience of the handling of the vehicle, but which do not directly affect the road safety. This may relate, for example to the eigenfrequency of the vehicle, which is modified when a heavy component is fitted right at the back of the vehicle. Depending, among other things, on the type of vehicle and the type of suspension, the eigenfrequency of the vehicle affects the vibrations in the driver's cab. These handling characteristics can also be calculated by the method according to the invention. The result of the calculations can also be compared with a predefined interval, results outside the interval possibly prompting reinforcements of the vehicle or modifications to the chosen equipment.

These changes manifest themselves most clearly when the vehicle is unladen. The more the vehicle is loaded, the less difference the auxiliary equipment makes. Other characteristics, such as the wheel tracking, are also modified for an unladen vehicle with a heavy superstructure right at the back.

The invention must not be regarded as being limited to the exemplary embodiments described above, a number of further variants and modifications being feasible without departing from the scope of the following patent claims. For example, the method according to the invention may also be used for the design calculation of superstructures on other types of vehicle, such as trailer vehicles.

The invention claimed is:

1. A method of producing a vehicle to be fitted with auxiliary equipment, comprising:
   specifying a vehicle chassis number of the vehicle to a vehicle database for collecting from the vehicle database a corresponding model vehicle specification and its parameters;
   specifying parameters pertaining to the auxiliary equipment;
   performing a strength calculation, based on the parameters of the model vehicle and a model of the auxiliary equipment, for the model vehicle in combination with the model auxiliary equipment fitted thereto;
   adding a model reinforcement to the model combination of model vehicle and model auxiliary equipment when a result of the strength calculation lies outside a predefined interval;
   when the result of the strength calculation lies outside of the predefined interval, performing a new calculation of a strength of the model vehicle combination of the model vehicle, the model auxiliary equipment and the model reinforcement; and
   adding an actual reinforcement to the vehicle when a result of the strength calculation verifies that the model vehicle with the model reinforcement has sufficient strength to support the model auxiliary equipment,
   wherein the auxiliary equipment comprises additional equipment fitted to the vehicle wherein additional equipment fitted to the vehicle comprises at least one of a tail lift, a crane, and a towing arrangement.

2. A method as claimed in claim 1, comprising sanctioning a combination of vehicle and auxiliary equipment when the result of the strength calculation lies within a predefined interval.

3. A method as claimed in claim 2, comprising performing a calculation of handling characteristics for the vehicle in combination with the auxiliary equipment fitted thereto.

4. A method as claimed in claim 1, comprising adding as the reinforcement a member which is fitted to a frame of the vehicle.

5. A method as claimed in claim 4, comprising adding as the reinforcement a member which is fitted on top of the frame of the vehicle.

6. A method as claimed in claim 5, comprising performing a calculation of handling characteristics for the vehicle in combination with the auxiliary equipment fitted thereto.

7. A method as claimed in claim 4, comprising performing a calculation of handling characteristics for the vehicle in combination with the auxiliary equipment fitted thereto.

8. A method as claimed in claim 1, comprising performing a calculation of handling characteristics for the vehicle in combination with the auxiliary equipment fitted thereto.

9. A computer programmed with program code for performing the calculations in the method as claimed in claim 1.

10. A computer program product comprising program code stored on a non-transitory machine-readable medium for performing the calculations in the method as claimed in claim 1, the program being executable by a computer.

11. A method of producing a vehicle to be fitted with auxiliary equipment, comprising:

specifying a vehicle chassis number of the vehicle to a vehicle database for collecting from the vehicle database a corresponding model vehicle specification and its parameters;

specifying parameters pertaining to the auxiliary equipment;

performing a strength calculation, based on the parameters of the model vehicle and a model of the auxiliary equipment, for the model vehicle in combination with the model auxiliary equipment fitted thereto;

adding a model reinforcement to the model combination of model vehicle and model auxiliary equipment when a result of the strength calculation lies outside a predefined interval;

when the result of the strength calculation lies outside of the predefined interval, performing a new calculation of a strength of the model vehicle combination of the model vehicle, the model auxiliary equipment and the model reinforcement; and adding an actual reinforcement to the vehicle when a result of the strength calculation verifies that the model vehicle with the model reinforcement has sufficient strength to support the model auxiliary equipment, wherein the auxiliary equipment comprises conversion of major parts of the vehicle wherein conversion of major parts of the vehicle comprises converting the vehicle for use as a fire engine.

12. A method as claimed in claim 11, comprising sanctioning a combination of vehicle and auxiliary equipment when the result of the strength calculation lies within a predefined interval.

13. A method as claimed in claim 12, comprising performing a calculation of handling characteristics for the vehicle in combination with the auxiliary equipment fitted thereto.

14. A method as claimed in claim 11, comprising adding as the reinforcement a member which is fitted to a frame of the vehicle.

15. A method as claimed in claim 14, comprising adding as the reinforcement a member which is fitted on top of the frame of the vehicle.

16. A method as claimed in claim 15, comprising performing a calculation of handling characteristics for the vehicle in combination with the auxiliary equipment fitted thereto.

17. A method as claimed in claim 14, comprising performing a calculation of handling characteristics for the vehicle in combination with the auxiliary equipment fitted thereto.

18. A method as claimed in claim 11, comprising performing a calculation of handling characteristics for the vehicle in combination with the auxiliary equipment fitted thereto.

19. A computer programmed with program code for performing the calculations in the method as claimed in claim 11.

20. A computer program product comprising program code stored on a non-transitory machine-readable medium for performing the calculations in the method as claimed in claim 11, the program being executable by a computer.

* * * * *